(12) United States Patent
Sakurai

(10) Patent No.: US 6,731,182 B2
(45) Date of Patent: May 4, 2004

(54) VOLTAGE-CONTROLLED OSCILLATOR AND COMMUNICATION APPARATUS EMPLOYING THE SAME

(75) Inventor: Shoji Sakurai, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/231,111

(22) Filed: Aug. 30, 2002

(65) Prior Publication Data
US 2003/0042989 A1 Mar. 6, 2003

(30) Foreign Application Priority Data
Aug. 30, 2001 (JP) .......................... 2001-261307

(51) Int. Cl.[7] .............................................. H03B 1/00
(52) U.S. Cl. ................. 331/177 V; 331/36 C; 331/117 FE; 331/117 R
(58) Field of Search .................. 331/36 C, 117 FE, 331/117 R, 117 V

(56) References Cited

U.S. PATENT DOCUMENTS 6,046,647 A * 4/2000 Nelson .................. 331/105
6,542,043 B1 * 4/2003 Cao .................. 331/117 FE

* cited by examiner

*Primary Examiner*—Kenneth B. Wells
(74) *Attorney, Agent, or Firm*—Birch, Stewart, Kolasch & Birch, LLP

(57) ABSTRACT

A conventional voltage-controlled oscillator, when formed as an integrated circuit, suffers from a low Q factor of its resonant portion and thus poor phase noise characteristics. To overcome this, a voltage-controlled oscillator of the invention has a resonant portion including at least one variable-capacitance device and at least one inductor, an active portion including differential pair transistors and supplying electric power to the resonant portion in such a way as not to attenuate the oscillation of the resonant portion, and a current source connected to the emitters or sources of both of the differential pair transistors. The current source is a circuit having a resistor and a capacitive device connected in parallel.

18 Claims, 5 Drawing Sheets

VOLTAGE-CONTROLLED OSCILLATOR AND COMMUNICATION APPARATUS EMPLOYING THE SAME

BACKGROUND OF THE INVENTION

1. Field of the Invention

The present invention relates to a voltage-controlled oscillator of which the oscillation frequency is varied according to a tuning voltage, and in particular to a voltage-controlled oscillator for use in a high-frequency communication apparatus or the like.

2. Description of the Prior Art

Voltage-controlled oscillators are generally used in high-frequency communication apparatus and the like, particularly as oscillators for frequency synthesizers serving as local oscillators in wireless communication apparatus. Now, a conventional voltage-controlled oscillator will be described.

FIG. 4 shows a typical configuration of a conventional voltage-controlled oscillator. The voltage-controlled oscillator includes a resonant portion 1 and an active portion 2.

The resonant portion 1 is a circuit having an inductor L1 and a variable-capacitance device C1, such as a variable-capacitance diode, connected in parallel. The symbol RT represents the sum of the parasitic resistance of the inductor L1 and the parasitic resistance of the variable-capacitance device C1. One of the nodes at which the inductor L1 and the variable-capacitance device C1 are connected together is connected to an output terminal S1, and the other is connected to an output terminal S2.

A reference voltage supply terminal 4 is connected to the half point of the inductor L1. A reference voltage $V_{CC}$ is supplied to the reference voltage supply terminal 4. The capacitance of the variable-capacitance device C1 is controlled by a tuning voltage $V_{tun}$ that is applied to a control terminal 5.

The active portion 2 includes NPN-type transistors Q1 and Q2, bias resistors R1 and R2, signal level adjustment capacitors C21, C22, C31, and C32, and a DC (direct-current) current source 3.

The collector of the transistor Q1 is connected to the output terminal S1, and the collector of the transistor Q2 is connected to the output terminal S2.

The base of the transistor Q1 and the collector of the transistor Q2 are connected together through the capacitor C21, and the base of the transistor Q2 and the collector of the transistor Q1 are connected together through the capacitor C22.

The base of the transistor Q1 is connected through the bias resistor R1 to a bias voltage supply terminal 6, and is also grounded through the capacitor C31. The base of the transistor Q2 is connected through the bias resistor R2 to the bias voltage supply terminal 6, and is also grounded through the capacitor C32.

The emitters of the transistors Q1 and Q2 are connected together, and are grounded through the DC current source 3.

The voltage-controlled oscillator configured as described above operates as follows. The resonant portion 1 outputs a signal having a given resonant frequency to the output terminals. The negative resistance of the active portion 2 is canceled by the resistance RT and the load resistance connected between the output terminals S1 and S2, and thus the output voltage $V_o$ appearing between the output terminals S1 and S2 is a standing wave. In this way, it is possible to obtain an output voltage $V_o$ having the desired frequency according to the $V_{tun}$.

One of the parameters that describe the performance of the resonant portion 1 is the Q factor. If the impedance of the resonant portion 1 is assumed to be Z, then the Q factor is given by formula (1) below.

$$Q = \text{Image}(Z)/\text{Real}(Z) \qquad (1)$$

On the other hand, if the offset frequency from the oscillation frequency is assumed to be $\Delta f$, then the phase noise $n(\Delta f)$ of the voltage-controlled oscillator is approximated by formula (2) below.

$$n(\Delta f) \propto 1/[Q^2 \times (\Delta f)^2] \qquad (2)$$

Hence, the higher the Q factor of the resonant portion 1, the more the phase noise can be reduced. For this reason, it is generally believed that portable communication apparatus require the use of voltage-controlled oscillators of which the resonant portion has a high Q factor.

On the other hand, in portable communication apparatus, to make them compact and inexpensive, voltage-controlled oscillators need to be formed as integrated circuits. However, monolithic passive devices have low Q factors, and therefore forming the resonant portion of a voltage-controlled oscillator as an integrated circuit lowers the Q factor of the resonant portion, degrading the phase noise characteristics of the voltage-controlled oscillator.

Japanese Patent Application Laid-Open No. H10-145190 proposes to solve this problem by adopting a circuit configuration that reduces phase noise, and by forming an inductor out of bonding wire.

FIG. 5 shows a voltage-controlled oscillator disclosed in Japanese Patent Application Laid-Open No. H10-145190 mentioned above. Here, such circuit elements and signals as are found also in FIG. 4 are identified with the same reference numerals and symbols, and overlapping explanations will not be repeated.

The voltage-controlled oscillator of FIG. 5 differs from the voltage-controlled oscillator of FIG. 4 in the following respects. The inductor L1 is replaced with inductors L11 and L12. The variable-capacitance device C1 is replaced with variable-capacitance diodes C11 and C12. The DC current source 3 is replaced with a resistor R3. The capacitors C31 and C32 are abolished. Between the inductor L11 and the variable-capacitance diode C11, a high-pass filter 7 composed of a capacitor and a resistor is inserted. Between the inductor L12 and the variable-capacitance diode C12, a high-pass filter 8 composed of a capacitor and a resistor is inserted. The cathodes of the variable-capacitance diodes C11 and C12 are connected together, and are then connected through a resistor R4 to the tuning voltage supply terminal 5.

In the voltage-controlled oscillator of FIG. 5, the high-pass filters 7 and 8 provided in the resonant portion serve to separate the resonant portion from low-frequency fluctuation of the reference voltage $V_{CC}$, thereby reducing phase noise. However, the provision of the high-pass filters 7 and 8 in the resonant portion tends to lower the Q factor of the resonant portion as a whole and thus eventually increase phase noise $n(\Delta f)$.

Japanese Patent Application Laid-Open No. H10-145190 mentioned above also discloses a configuration in which, for the sake of integration, the inductors L11 and L12 are replaced with bonding wires. This configuration, however, suffers from lower reliability of the oscillator, when mounted, and increased variations in the inductances of the inductors.

SUMMARY OF THE INVENTION

An object of the present invention is to provide a voltage-controlled oscillator that offers satisfactory phase noise characteristics even when formed as an integrated circuit.

To achieve the above object, according to the present invention, a voltage-controlled oscillator is provided with a resonant portion including at least one variable-capacitance device and at least one inductor, an active portion including differential pair transistors and supplying electric power to the resonant portion in such a way as not to attenuate the oscillation of the resonant portion, and a current source connected to the emitters or sources of both of the differential pair transistors. Here, the current source is a circuit having a resistor and a capacitive device connected in parallel.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
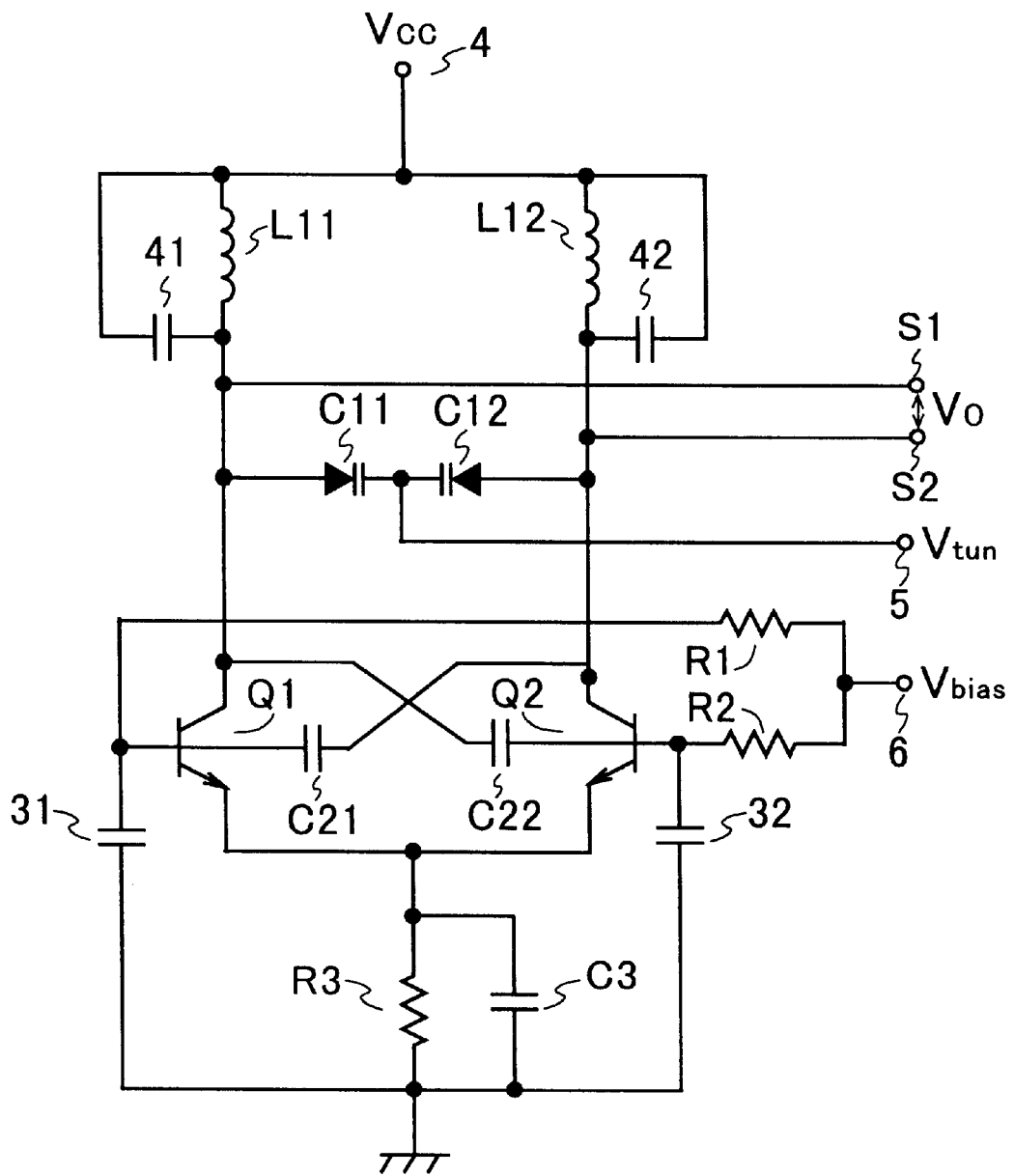
FIG. 1 is a diagram showing the configuration of the voltage-controlled oscillator of a first embodiment of the invention.
Figure 5:
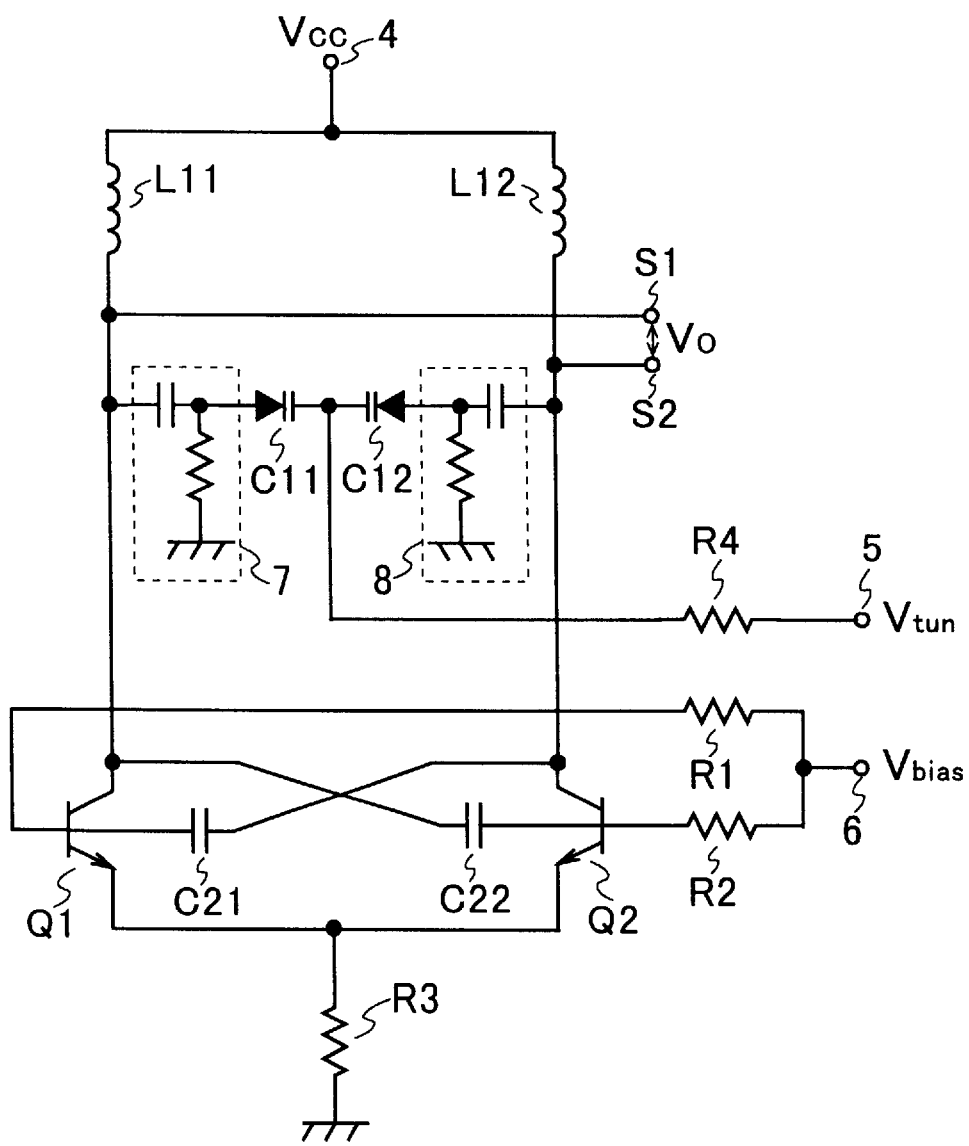
FIG. 5 is a diagram showing the configuration of another conventional voltage-controlled oscillator.

Hereinafter, embodiments of the present invention will be described with reference to the drawings. FIG. 1 shows the configuration of the voltage-controlled oscillator of a first embodiment of the invention. Here, such circuit elements and signals as are found also in FIG. 5 are identified with the same reference numerals and symbols, and overlapping explanations will not be repeated.

A capacitor C3 has one end connected to the emitters of the transistors Q1 and Q2, and has the other end grounded. That is, the capacitor C3 is connected in parallel with the resistor R3 so as to form together with it a current source.

Where the current source is composed of the resistor R3 alone, harmonic components of the oscillation frequency flow in phase into the emitters of the transistors Q1 and Q2, and thus cause fluctuation in the emitter potential, increasing phase noise. On the other hand, where the current source is configured as a current mirror circuit composed of transistors, the current mirror circuit itself generates low-frequency noise, increasing phase noise.

In the voltage-controlled oscillator of the first embodiment, by contrast, the capacitor C3 eliminates the harmonic components of the oscillation frequency that flow in phase into the emitters of the transistors Q1 and Q2, and thus serves to reduce the fluctuation of the emitter potential of the transistors Q1 and Q2. Moreover, since the current source is composed of the resistor R3 and the capacitor C3, it does not generate low-frequency noise. As a result, the voltage-controlled oscillator of the first embodiment operates with reduced phase noise.

A signal level adjustment capacitor C31 has one end connected to the bias resistor R1 and to the base of the transistor Q1, and a signal level adjustment capacitor C32 has one end connected to the bias resistor R2 and to the base of the transistor Q2. The signal level adjustment capacitors C31 and C32 both have the other end grounded.

A fixed capacitor C41 is connected in parallel with the inductor L11, and a fixed capacitor C42 is connected in parallel with the inductor L12. Fixed capacitors have higher Q factors than variable capacitors, and therefore the provision of the fixed capacitors C41 and C42 helps heighten the Q factor of the resonant portion as a whole.

Figure 2:
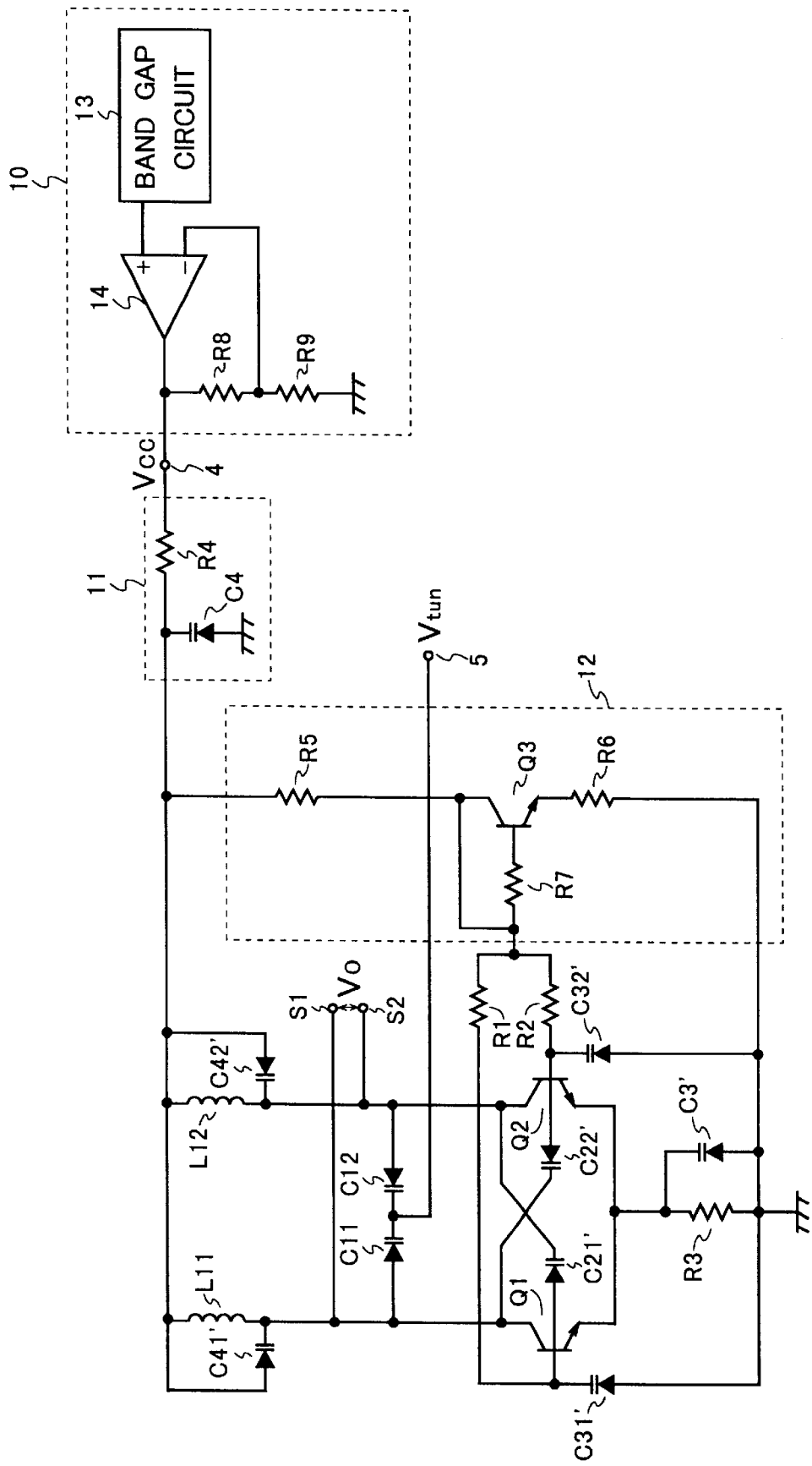
FIG. 2 is a diagram showing the configuration of the voltage-controlled oscillator of a second embodiment of the invention.

Next, the voltage-controlled oscillator of a second embodiment of the invention will be described. FIG. 2 shows the configuration of the voltage-controlled oscillator of the second embodiment. Here, such circuit elements and signals as are found also in FIG. 1 are identified with the same reference numerals and symbols, and overlapping explanations will not be repeated.

The voltage-controlled oscillator of the second embodiment receives a reference voltage $V_{CC}$ from a regulator 10. That is, the regulator 10 is, as an external power source, connected to the reference voltage supply terminal 4.

The regulator 10 includes a band gap circuit 13, an error amplifier 14, and resistors R8 and R9. The output side of the band gap circuit 13 is connected to the non-inverting input terminal of the error amplifier 14. The output terminal of the error amplifier 14 is connected to one end of the resistor R8, and serves as the output side of the regulator 10. The other end of the resistor R8 is grounded through the resistor R9. The node at which the resistors R8 and R9 are connected together is connected to the inverting input terminal of the error amplifier 14.

In general, a voltage-controlled oscillator employed in a portable communication apparatus or the like uses as a reference voltage a constant voltage output from a band gap circuit. A band gap circuit includes a current mirror circuit, and therefore it inherently produces low-frequency fluctuation. If this low-frequency oscillation reaches the resonant portion of the voltage-controlled oscillator, it adds to phase noise.

On the other hand, the regulator 10 reduces the low-frequency oscillation of its output voltage through negative feedback. Therefore, by using the output voltage of the regulator 10 as the reference voltage $V_{CC}$, as in the voltage-controlled oscillator of the second embodiment described later, it is possible to reduce phase noise resulting from low-frequency oscillation originating from an external power source.

Moreover, in the voltage-controlled oscillator of the second embodiment, between the reference voltage supply terminal 4 and the inductors L11 and L12 is provided a ripple elimination circuit 11. The ripple elimination circuit 11 is a low-pass filter composed of a resistor R4 and a variable-capacity diode C4. One end of the resistor R4 serves as the input side of the ripple elimination circuit 11, and is connected to the reference voltage supply terminal 4. The other end of the resistor R4 is connected to the cathode of the variable-capacity diode C4, and the anode of the variable-capacity diode C4 is grounded. The node at which the resistor R4 and the variable-capacity diode C4 are connected together serves as the output side of the ripple elimination circuit 11. The output side of the ripple elimination circuit 11 is connected to the node at which the inductors L11 and L12 are connected together, and to the input side of a temperature compensation circuit 12, which will be described later.

The ripple elimination circuit 11 receives the reference voltage $V_{CC}$, and, after eliminating high-frequency component noise from it, supplies it to the resonant portion and to the temperature compensation circuit 12. This makes it possible to reduce high-frequency component phase noise.

In general, as temperature rises, the parasitic resistance of the resonant portion increases, and thus the voltage-controlled oscillator tends to have smaller oscillation allowance. This tendency is striking particularly in voltage-controlled oscillators of which the resonant portion has a low Q factor.

To solve this problem, the voltage-controlled oscillator of the second embodiment is provided with a temperature compensation circuit 12. The temperature compensation circuit 12 includes resistors R5 to R7 and an NPN-type transistor Q3.

One end of the resistor R5 serves as the input side of the temperature compensation circuit 12, and is connected to the output side of the ripple elimination circuit 11. The other end of the resistor R5 is connected to the collector of the transistor Q3, and the emitter of the transistor Q3 is grounded through the resistor R6. The base of the transistor Q3 is connected to one end of the resistor R7, and the other end of the resistor R7 serves as the output side of the temperature compensation circuit 12. The other end of the resistor R7 is also connected to the collector of the transistor Q3.

The temperature compensation circuit 12 operates as follows. The resistances of the resistors R5 to R7 have positive temperature coefficients, and therefore, as temperature rises, the resistors R5 to R7 have higher resistances. On the other hand, the base-emitter voltage $V_{BE}$ of the transistor Q3 has a negative temperature coefficient, and therefore, as temperature rises, the base-emitter voltage $V_{BE}$ of the transistor Q3 decreases. Thus, by exploiting these characteristics so that the resistors R5 to R7 are given adequate resistances, it is possible to control the increase or decrease of the bias current in relation to a rise in temperature. In this way, it is possible to increase the bias current supplied to the bases of the transistors Q1 and Q2 according to a rise in temperature and thereby increase the gain of the active portion. As a result, the voltage-controlled oscillator of the second embodiment operates stably without exhibiting smaller oscillation allowance even at high temperatures.

Furthermore, in the voltage-controlled oscillator of the second embodiment, spiral inductors are used as the inductors L11 and L12. This makes it possible to form all the constituent devices of the voltage-controlled oscillator within an integrated circuit. Thus, the voltage-controlled oscillator of the second embodiment is so configured as to be formed within a single semiconductor integrated circuit. In this way, it is possible to realize a compact, inexpensive voltage-controlled oscillator. Forming the voltage-controlled oscillator as an integrated circuit lowers the Q factor of its resonant portion. However, the current source configured as a circuit having the resistor R3 and the capacitor C3 connected in parallel helps reduce phase noise. Thus, it is possible to realize a voltage-controlled oscillator that offers satisfactory phase noise characteristics.

Moreover, in the voltage-controlled oscillator of the second embodiment, all the capacitive devices used are variable-capacitance diodes. Specifically, in the voltage-controlled oscillator of the second embodiment, variable-capacitance diodes C3', C21', C22', C31', C32', C41', and C42' are respectively used in place of the capacitors C3, C21, C22, C31, C32, C41, and C42 used in the voltage-controlled oscillator of the first embodiment. In addition, a constant reverse bias is applied across each of these variable-capacitance diodes so that they serve as fixed capacitors. Using variable-capacitance diodes as capacitive devices in this way helps reduce the area required for their mounting, and thus helps reduce the area required for the mounting of the voltage-controlled oscillator.

The Q factor of a variable-capacitance diode varies according to the reverse bias applied across it. In general, a variable-capacitance diode exhibits its maximum Q factor when a reverse bias higher than a predetermined level is applied across it. Accordingly, in the voltage-controlled oscillator of the second embodiment, the reverse biases applied across the individual variable-capacitance diodes are so set that they exhibit high Q factors.

Here, it is advisable to give identical structures to the variable-capacitance diodes C11 and C12 and to those C3', C21', C22', C31', C32', C41', and C42' used as fixed capacitors. This makes it possible to form the variable-capacitance diodes used as fixed capacitors in the same fabrication step as the variable-capacitance diodes C11 and C12. When the variable-capacitance diodes used as fixed capacitors are formed, dummy variable-capacitance diodes may be formed together within the semiconductor integrated circuit so that, even when the actual oscillation frequency turns out to be deviated from the desired frequency because of parasitic capacitance or the like, it is possible to readily adjust the oscillation frequency simply by modifying the pattern of the conductor layer.

Figure 3:
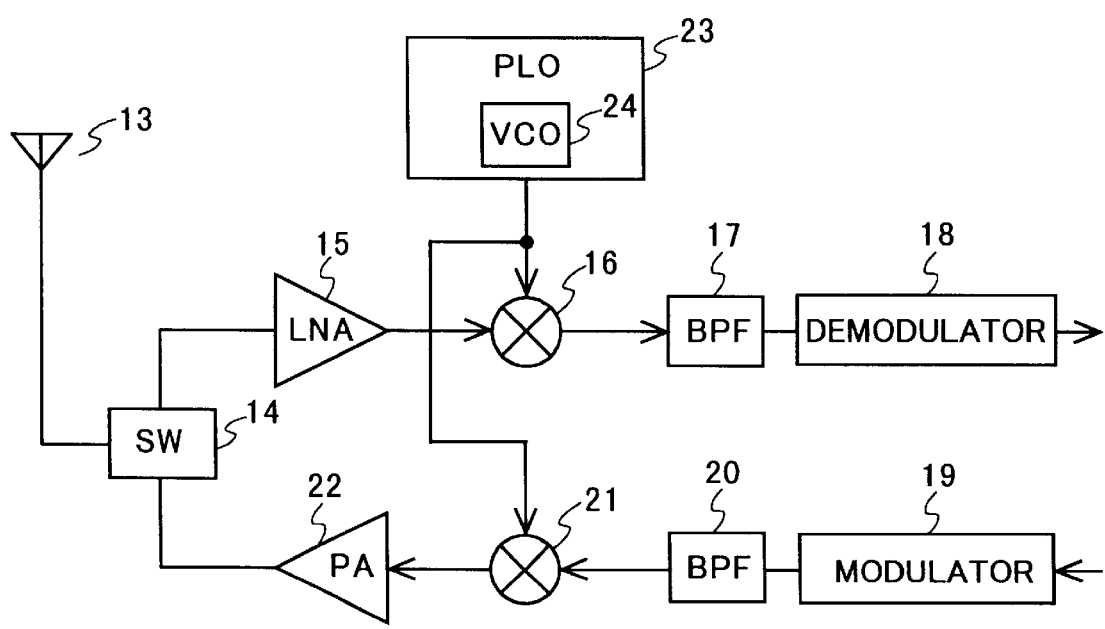
FIG. 3 is a block diagram of a transceiver apparatus embodying the invention.
Figure 4:
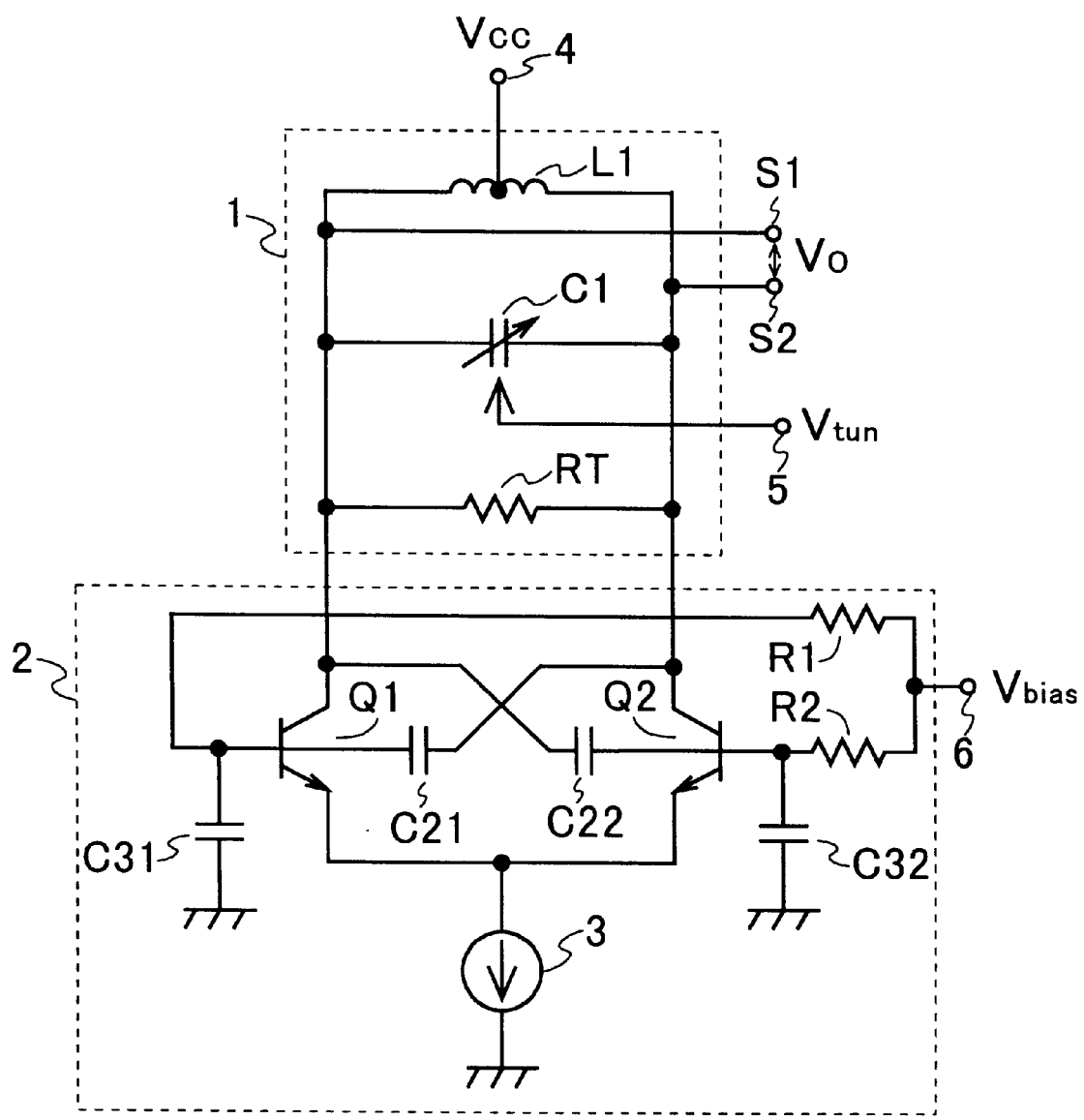
FIG. 4 is a diagram showing the configuration of a conventional voltage-controlled oscillator.

Next, a transceiver apparatus embodying the invention will be described. FIG. 3 shows a circuit block diagram of a transceiver apparatus embodying the invention. This transceiver apparatus incorporates, as a voltage-controlled oscillator (VCO) 24, the voltage-controlled oscillator of the second embodiment described above, and has its whole circuit, except an antenna 13, formed in a single-chip semiconductor integrated circuit device.

First, the receiver portion of the transceiver apparatus will be described. An RF (radio frequency) signal received by the antenna 13 is fed through a switch (SW) 14 to a low-noise amplifier (LNA) 15, where the RF signal is amplified. The RF signal is then fed to a mixer 16, where the RF signal is mixed with a local oscillation signal and is thereby down-converted into an IF (intermediate frequency) signal. The IF signal is passed through a band-pass filter (BPF) 17 so that unnecessary frequency components are eliminated from it, and is then fed to a demodulator 18, where the IF signal is demodulated back to the received signal in its original form.

Next, the transmitter portion of the transceiver apparatus will be described. A signal to be transmitted is modulated by a modulator 19. The modulated signal is passed through a band-pass filter (BPF) 20 so that unnecessary frequency components are eliminated from it, and is then fed to a mixer 21, where the modulated signal is mixed with the local oscillation signal and is thereby up-converted into an RF signal. The RF signal is subjected to power amplification by a power amplifier (PA) 22, and is then fed through the switch 14 to the antenna 14 so as to be transmitted therefrom.

The local oscillation signal is fed from a phase-locked oscillator (PLO) 23. The phase-locked oscillator 23 includes a frequency divider (not shown), a quartz crystal oscillator (not shown), a phase comparator (not shown), and the voltage-controlled oscillator 24. The frequency divider divides the output of the voltage-controlled oscillator 24 down to the frequency of the quartz crystal oscillator. The phase comparator compares phases between this frequencydivided signal and the signal from the quartz crystal oscillator to produce an error signal, which the phase comparator feeds back to the voltage-controlled oscillator 24 to achieve negative feedback and thereby stabilize the frequency of the local oscillation signal.

The voltage-controlled oscillator 24 receives as a reference voltage the output voltage of a regulator, and the other circuit blocks than the voltage-controlled oscillator receives as a supplied voltage the output voltage of a band gap circuit. The regulator incorporates a band gap circuit, which is shared as the band gap circuit that is connected to the other circuit blocks than the voltage-controlled oscillator. In this configuration, even when the output voltage of the band gap circuit is varied to vary the supply voltage for the circuit blocks other than the voltage-controlled oscillator, the reference voltage $V_{CC}$ for the voltage-controlled oscillator 24 is kept constant. Thus, it is possible to maintain the characteristics of the voltage-controlled oscillator 24. Even if noise is present in the supply voltage for the circuit blocks other than the voltage-controlled oscillator, almost no noise appears in the reference voltage $V_{CC}$ for the voltage-controlled oscillator.

In a voltage-controlled oscillator, the higher the oscillation frequency, the more likely its resonant portion exhibits a low Q factor. Therefore, a communication apparatus according to the present invention is suitably used where transmitted and received signals are in a high-frequency band, for example signals complying with the Bluetooth™ standards.

All the embodiments described above deal with cases where bipolar transistors are used as the differential pair transistors provided in the active portion. However, it is also possible to use instead differently structured transistors, for example MOSFETs (metal-oxide semiconductor field-effect transistors) or MESFETs (metal semiconductor field-effect transistors).

The embodiment described last deals with a transceiver apparatus capable of both transmission and reception. However, the present invention applies not only to this type of communication apparatus, but also to communication apparatus capable of transmission only or reception only.

What is claimed is:

1. A voltage-controlled oscillator comprising:
    a resonant portion including at least one variable-capacitance device and at least one inductor, and
    a first capacitance device connected in parallel with the inductor, the capacitive device having an identical structure with the variable-capacitance device;
    an active portion including differential pair transistors and supplying electric power to the resonant portion in such a way as not to attenuate oscillation of the resonant portion;
    a current source connected to emitters or sources of both of the differential pair transistors, and is a circuit having a resistor and a second capacitive device connected in parallel; and
    wherein at least the variable-capacitance device included in the resonant portion, the active portion, and the current source are formed within a single semiconductor integrated circuit.

2. The voltage-controlled oscillator as claimed in claim 1, wherein the second capacitive device has an identical structure with the variable-capacitance device.

3. The voltage-controlled oscillator as claimed in claim 1, wherein the inductor is a spiral inductor.

4. The voltage-controlled oscillator as claimed in claim 1, further comprising:
    a ripple elimination circuit for eliminating a ripple component contained in a reference voltage supplied from outside,
    wherein the voltage-control oscillator is driven by the reference voltage having the ripple component eliminated by the ripple elimination circuit.

5. The voltage-controlled oscillator as claimed in claim 4, wherein the ripple elimination circuit is a low-pass filter.

6. The voltage-controlled oscillator as claimed in claim 1, wherein an output voltage of a regulator is supplied from outside as a reference voltage, and the voltage-controlled oscillator is driven by the output voltage of the regulator or a voltage based on the output voltage of the regulator.

7. The voltage-controlled oscillator as claimed in claim 1, further comprising:
    a temperature compensation circuit that supplies a temperature-compensated bias current to bases or gates of the differential pair transistors.

8. The voltage-controlled oscillator as claimed in claim 7, wherein the temperature compensation circuit increases the bias current as temperature rises.

9. The voltage-controlled oscillator as claimed in claim 7, wherein, of the differential pair transistors, one has the base or gate thereof connected to a first resistor and the other has the base or gate thereof connected to a second resistor, and
    the temperature compensation circuit includes a transistor that receives, at a collector thereof, a predetermined voltage through a third resistor, that has an emitter thereof grounded through a fourth resistor, and that has a base thereof connected, through a fifth resistor, to a node at which the first and second resistors are connected together and also to the collector of the transistor itself.

10. A communication apparatus including a voltage-controlled oscillator outputting a signal from which a local oscillation signal is produced, the voltage-controlled oscillator comprising:
    a resonant portion including at least one variable-capacitance device, at least one inductor and a first capacitive device connected in parallel with the inductor, the capacitive device having an identical structure with the variable-capacitance device;
    an active portion including differential pair transistors and supplying electric power to the resonant portion in such a way as not to attenuate oscillation of the resonant portion; and
    a current source connected to emitters or sources of both of the differential pair transistors, and is a circuit having a resistor and a second capacitive device connected in parallel; and
    wherein at least the variable-capacitance device included in the resonant portion, the active portion, and the current source are formed within a single semiconductor integrated circuit.

11. The communication apparatus as claimed in claim 10 wherein the second capacitive device has an identical structure with the variable-capacitance device.

12. The communication apparatus as claimed in claim 10, wherein the inductor is a spiral inductor.

13. The communication apparatus as claimed in claim 10, wherein the voltage-controlled oscillator further comprises a ripple elimination circuit for eliminating a ripple component contained in a reference voltage supplied from outside, and the voltage-controlled oscillator is driven by the reference voltage having the ripple component eliminated by the ripple elimination circuit.

14. The communication apparatus as claimed in claim 13, wherein the ripple elimination circuit is a low-pass filter.

15. The communication apparatus as claimed in claim 10, wherein an output voltage of a regulator is supplied as a reference voltage from outside the voltage-controlled oscillator, and the voltage-controlled oscillator is driven by the output voltage of the regulator or a voltage based on the output voltage of the regulator.

16. The communication apparatus as claimed in claim 10, wherein the voltage-controlled oscillator further comprises a temperature compensation circuit that supplies a temperature-compensated bias current to bases or gates of the differential pair transistors.

17. The communication apparatus as claimed in claim 16, wherein the temperature compensation circuit increases the bias current as temperature rises.

18. The communication apparatus as claimed in claim 16, wherein, of the differential pair transistors, one has the base or gate thereof connected to a first resistor and the other has the base or gate thereof connected to a second resistor, and the temperature compensation circuit includes a transistor that receives, at a collector thereof, a predetermined voltage through a third resistor, that has an emitter thereof grounded through a fourth resistor, and that has a base thereof connected, through a fifth resistor, to a node at which the first and second resistors are connected together and also to the collector of the transistor itself.

* * * * *